United States Patent
Ku et al.

(10) Patent No.: US 9,432,058 B2
(45) Date of Patent: Aug. 30, 2016

(54) ERROR CORRECTION APPARATUS AND ASSOCIATED METHOD

(71) Applicant: MStar Semiconductor, Inc., Hsinchu Hsien (TW)

(72) Inventors: Yu-Hsien Ku, Zhubei (TW); Tung-Sheng Lin, Zhubei (TW); Yi-Ying Liao, Zhubei (TW)

(73) Assignee: MStar Semiconductor, Inc., Hsinchu Hsien (TW)

(*) Notice: Subject to any disclaimer, the term of this patent is extended or adjusted under 35 U.S.C. 154(b) by 139 days.

(21) Appl. No.: 14/024,783

(22) Filed: Sep. 12, 2013

(65) Prior Publication Data

US 2014/0075263 A1 Mar. 13, 2014

(30) Foreign Application Priority Data

Sep. 13, 2012 (TW) .............................. 101133505 A

(51) Int. Cl.
*H03M 13/29* (2006.01)
*H03M 13/11* (2006.01)
*H03M 13/00* (2006.01)
*H03M 13/15* (2006.01)
*H03M 13/25* (2006.01)

(52) U.S. Cl.
CPC ..... *H03M 13/2906* (2013.01); *H03M 13/1128* (2013.01); *H03M 13/6502* (2013.01); *H03M 13/6552* (2013.01); *H03M 13/1165* (2013.01); *H03M 13/15* (2013.01); *H03M 13/152* (2013.01); *H03M 13/255* (2013.01); *H03M 13/29* (2013.01)

(58) Field of Classification Search
CPC .. H03M 13/29; H03M 13/15; H03M 13/152; H03M 13/255; H03M 13/2906; H03M 13/1128; H03M 13/6552; H03M 13/6502; H03M 13/1165

USPC .......................................... 714/755, 758, 782
See application file for complete search history.

(56) References Cited

U.S. PATENT DOCUMENTS

| 6,557,126 | B1* | 4/2003 | Kelly .................. | G11B 7/1267 |
| | | | | 369/116 |
| 8,151,162 | B2* | 4/2012 | Kanaoka et al. ............. | 714/755 |
| 8,537,919 | B2* | 9/2013 | Fonseka et al. .............. | 375/265 |
| 2007/0150774 | A1* | 6/2007 | Seng .................. | G11B 20/1217 |
| | | | | 714/699 |
| 2010/0313099 | A1* | 12/2010 | Yamaga ............... | G06F 11/1012 |
| | | | | 714/755 |
| 2010/0332951 | A1* | 12/2010 | Peng ....................... | G11C 5/143 |
| | | | | 714/773 |

FOREIGN PATENT DOCUMENTS

CN 101194451 A 6/2008

OTHER PUBLICATIONS

Taiwan Office Action, Oct. 17, 2014, 5 pages.

* cited by examiner

*Primary Examiner* — Cynthia Britt
*Assistant Examiner* — Sazzad Hossain
(74) *Attorney, Agent, or Firm* — Edell, Shapiro & Finnan, LLC

(57) ABSTRACT

An error correction apparatus for a digital signal received by a signal reception terminal includes two error correction modules. The first error correction module performs first error correction on an input signal to generate an intermediate signal satisfying a termination condition. The second error correction module receives and selectively performs second error correction on the intermediate signal to generate a corrected signal. The termination condition is associated with a maximum error correction capability of the second error correction.

2 Claims, 2 Drawing Sheets

ERROR CORRECTION APPARATUS AND ASSOCIATED METHOD

This application claims the benefit of Taiwan application Serial No. 101133505, filed Sep. 13, 2012, the subject matter of which is incorporated herein by reference.

BACKGROUND OF THE INVENTION

1. Field of the Invention

The invention relates in general to an error correction technique, and more particularly, to an application employing a dual error correction mechanism.

2. Description of the Related Art

With advancements in communication techniques, digital television broadcasting gradually matures. Apart from being transmitted via cables, digital television signals can also be transmitted in a form of wireless signals via a base station or a satellite. The Digital Video Broadcasting—Second Generation—Terrestrial (DVB-T2) and the Digital Video Broadcasting—Satellite—Second Generation (DVB-S2) are prevalent standards in digital television broadcasting.

To ensure image quality at a reception terminal is not excessively affected during the signal transmission process, a dual error correction mechanism is employed at a transmission terminal of both of the above digital television broadcasting systems—a Boss-Chaudhuri-Hocquenghem (BCH) error-correcting code and a low-density parity check (LDPC) error-correcting code. Correspondingly, a reception terminal of a digital television broadcasting system needs to first perform LDPC error correction and BCH error correction. The BCH error correction is fast and low power-consuming, and primarily serves for reexamination.

The LDPC error correction is a sequentially performed iteration procedure. An error correction process commonly adopted by most digital television broadcasting reception terminals is as the flowchart shown in FIG. 1. In step S11, LDPC error correction is performed on an input signal. In step S12, it is determined whether the number of times or the total amount of time of the LDPC error correction reaches an upper limit, which selectively involves an upper number limit and an upper time limit. Step S13 is performed when a determination result of step S12 is negative. For example, the upper number limit of LDPC error correction may be set to five times, and the upper time limit of the error correction may be the time point at which a next data packet arrives. Step S14 is performed when the determination result of step S12 is affirmative to directly perform BCH error correction on an output result of the LDPC error correction. In step S13, it is determined whether a current corrected result still contains errors. Step S11 is again performed when a determination result of step S13 is negative, until the determination result of step S12 is affirmative or the determination result of step S13 is negative.

As seen from FIG. 1, every time an input signal is at a high error level, the examination of step S13 is usually failed. As such, step S11 may be repeatedly performed for quite a number of times before the number of times or the amount of time of the LDPC correction performed reaches the upper limit, such that the total time for error correction is remarkably increased and an overall performance of a reception terminal of a digital television broadcasting system is thus degraded.

SUMMARY OF THE INVENTION

The invention is directed to an error correction apparatus and an error correction method. By determining a stop time of a first-half error correction according to an error correction capability of a second-half error correction, the total time for error correction can be effectively reduced. The error correction apparatus and the error correction method of the present invention are not only applicable to television broadcasting systems but can also be implemented to various signal processing fields requiring dual error correction.

According to an embodiment of the present invention, an error correction apparatus for a digital signal received at a signal reception terminal is provided. The error correction apparatus comprises two error correction modules. The first error correction module performs first error correction on an input signal to generate an intermediate signal satisfying a termination condition. The second error correction module receives and selectively performs second error correction on the intermediate signal to generate a corrected signal. The termination condition is associated with a maximum error correction capability of the second error correction.

According to another embodiment of the present invention, an error correction method for a digital signal received at a signal reception terminal is provided. The error correction comprises the following steps. First error correction is performed on an input signal to generate an intermediate system satisfying a termination condition. Second error correction is selectively performed on the established intermediate signal to generate a corrected signal. The terminal condition is associated with an upper error correction capability of the second error correction.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
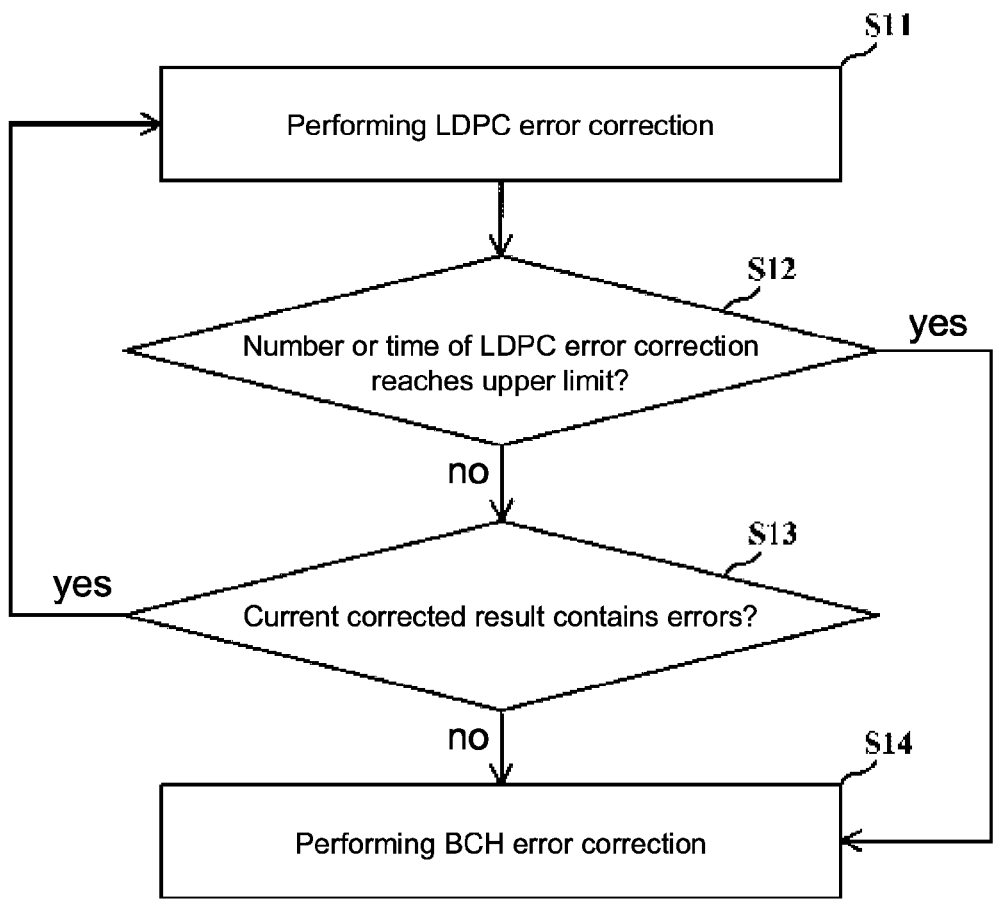
FIG. 1 is a flowchart of an error correction method in the prior art.
Figure 2:
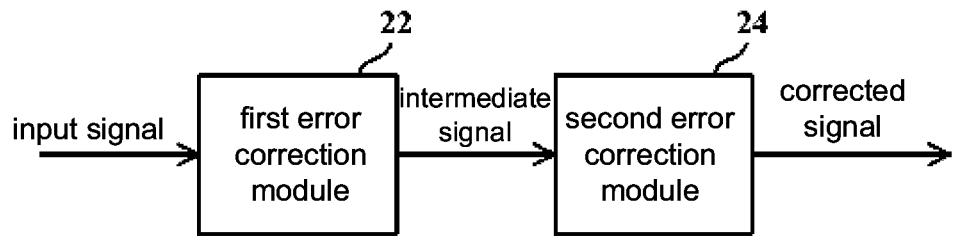
FIG. 2 is a block diagram of an error correction apparatus according to an embodiment of the present invention.

FIG. 2 shows an error correction apparatus 200 according to an embodiment of the present invention. The error correction apparatus 200 comprises a first error correction module 22 and a second error correction module 24. In practice, the error correction apparatus 200 may be integrated into a reception terminal of a DVB-S2 or DVB-T2 digital television, or may be an independent device. In the description below, it is assumed that the first error correction module 22 is a low-density parity check (LDPC) error correction module, and the second error correction module 24 is a Boss-Chaudhuri-Hocquenghem (BCH) error correction module 24. In an alternative embodiment, the first error correction module 22 and the second error correction module 24 may be other types of error correction modules.

The first (LDPC) error correction module 22 performs error correction (first error correction) on an input signal. The LDPC error correction is a sequential error correction iteration procedure. In practice, the first (LDPC) error correction module 22 generates an intermediate signal in a relative lower error level, e.g., a codeword having a size of n*1, after each time performing LDPC error correction. The codeword is multiplied by a parity check matrix having a size of m x n to obtain a vector having a size of 1*m. If the errors in the original input signal are completely corrected, the m number of elements of the vector representing the intermediate signal are all 0. In other words, an intermediate signal having m number of elements that are equal to 0 is theoretically a result of a corrected input signal. On the other hand, the error level of the intermediate signal is higher as the number of the elements in the m number of elements that are equal to 1 gets larger.

The first (LDPC) error correction module 22 determines an error level of the current intermediate signal according to the abovementioned m number of elements. For example, the first (LDPC) error correction module 22 may add up the m number of elements to generate a parity check sum as an error level E, and compare the error level E with a threshold. When the error level E of the current intermediate signal is greater than the threshold, the first (LDPC) error correction module 22 continues to again perform the LDPC error correction on the intermediate signal. In contrast, once the error level E of the current intermediate signal is smaller than the threshold, the first (LDPC) error correction module 22 terminates the LDPC error correction. In other words, the first (LDPC) error correction module 22 repetitively performs LDPC error correction on the input signal until the intermediate signal generated by the LDPC error correction procedure satisfies a termination condition.

The abovementioned threshold is associated with a maximum error correction capability of the second (BCH) error correction module 24. Assuming that the second (BCH) error correction module 24 is capable of completely correcting the intermediate signal having a maximum of t number of error bits, t is defined as the maximum error correction capability of the second (BCH) error correction module 24, i.e., t is a maximum recovery bit count of the BCH error correction. In different BCH error correction modes, the maximum error correction capability t may be different (e.g., equal to 10 or 12). The above threshold may be set as a product of the maximum error correction capability t and a predetermined weighting w. The predetermined weighting w may be a ratio of the error level E to the number of error bits of the intermediate signal (determined through simulation experiments or theoretical deduction), and is not limited to a predetermined number.

The BCH error correction module 24, coupled to the LDPC error correction module 22, performs subsequent BCH error correction on the intermediate signal after the above termination condition is satisfied, so as to generate a corrected signal. It is apparent that the intermediate signal, generated with referenced to an appropriately selected weighting w and then transmitted to the second (BCH) error correction module 24, can be adequately handled by the second (BCH) error correction module 24. That is, the second (BCH) error correction module 24 is capable of completely correcting the intermediate signal and thus generating an accurate corrected signal.

It should be noted that, the intermediate signal provided by the first (LDPC) error correction module 22 to the second (BCH) error correction module 24 may also be error-free. In such situation, instead of performing the BCH error correction, the second (BCH) error correction module 24 directly regards the intermediate signal as a corrected signal, and outputs the intermediate signal.

It is seen from the above description that, through appropriately setting a termination condition, the BCH error correction steps in before the first (LDPC) error correction module 22 completely corrects all errors; that is, the error correction apparatus 200 appropriately assigns a part of the error correction task to the second (BCH) error correction module 24. As previously stated, the BCH error correction is faster and involves lower computation power consumption. Compared to the prior art, the error correction apparatus 200 in average offers preferred performance. Further, by introducing the maximum error correction capability of the second (BCH) error correction module 24 as a parameter for setting the termination condition, it is ensured that the second (BCH) error correction module 24 is capable of completely correcting the intermediate signal.

Figure 3:
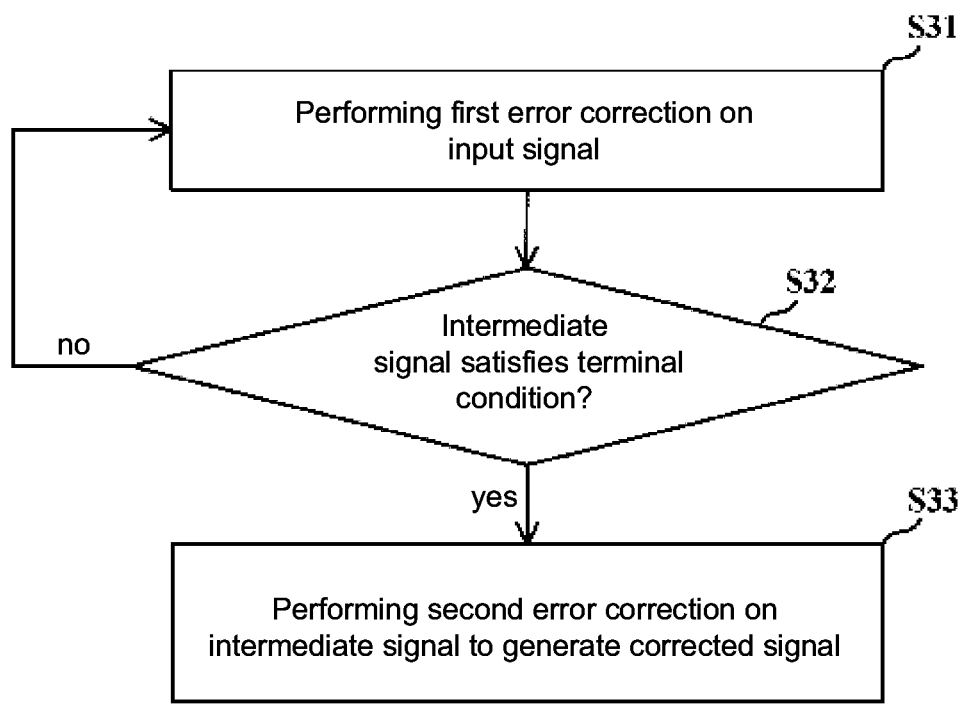
FIG. 3 is a flowchart of an error correction method according to an embodiment of the present invention.

FIG. 3 shows a flowchart of an error correction method according to another embodiment of the present invention. In step S31, first error correction is performed on an input signal. In step S23, it is determined whether an intermediate signal generated by the first error correction satisfies a termination condition. Step S31 is iterated when a determination result of step S32 is negative, or else step S33 is performed when the determination result of step S32 is affirmative. In step S33, second error correction is performed on the intermediate signal to generate a corrected signal. It should be noted that, as previously described, it is possible that the intermediate signal is error-free. In such situation, in step S33, rather than performing the second error correction on the intermediate signal, the intermediate signal is regarded as the corrected signal and directly output. Similar to the previous embodiment, the termination condition in this embodiment is that an error level of the intermediate signal is smaller than a threshold, which is associated with a maximum error correction capability of the second error correction. Various details associated with the error correction apparatus 200 are applicable to the error correction method in FIG. 3, and shall be omitted herein.

It should be noted that, the above apparatus and method are not limited to applications of LDPC error correction and BCH error correction. Methods for determining the intermediate signal and the error level may be adjusted according to actual applications of different error corrections.

With the above embodiments, in the error correction apparatus and the error correction method of the present invention, by determining a stop time of a first-half error correction according to an error correction capability of a second-half error correction, the total time for error correction can be effectively reduced. The error correction apparatus and the error correction method according to the embodiments of the present invention are not only applicable to television broadcasting systems but can also be implemented to various signal processing fields requiring a dual error correction.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An error correction apparatus, applied to a digital signal received at a signal reception terminal, comprising:
a first error correction module, configured to perform first error correction on an input signal to generate an intermediate signal satisfying a termination condition, wherein the input signal corresponds to the digital signal; and
a second error correction module, coupled to the first error correction module, for receiving and selectively performing second error correction on the intermediate signal to generate a corrected signal;

wherein, the termination condition is associated with a maximum error correction capability of the second error correction, wherein the first error correction is a low-density parity check (LDPC), wherein the termination condition is that an error level of the intermediate signal is smaller than a threshold, the error level is a parity check sum generated by the first error correction module according to the input signal and a parity check matrix, and the threshold is associated with the maximum error correction capability of the second error correction, and wherein when the intermediate signal is determined to be error-free, not performing the second error correction on the intermediate signal and outputting the intermediate signal as the corrected signal, wherein the second error correction is Boss-Chaudhuri-Hocquenghem (BCH) error correction, and the maximum error correction capability is associated with a maximum recovery bit count of the second error correction, wherein the termination condition is that an error level of the intermediate signal is smaller than the threshold, which is a product of the maximum error correction capability and a predetermined weighting, and wherein as a result of the threshold being calculated with respect to the maximum error correction capability, the second error correction completely corrects the intermediate signal.

2. An error correction method, applied to a digital signal received at a signal reception terminal, comprising:

performing first error correction on an input signal to generate an intermediate signal satisfying a termination condition, wherein the input signal corresponds to the digital signal;

after the termination condition is established, selectively performing second error correction on the intermediate signal to generate a corrected signal;

wherein, the termination condition is associated with a maximum error correction capability of the second error correction, wherein the first error correction is LDPC, wherein the termination condition is that an error level of the intermediate signal is smaller than a threshold, the error level is a parity check sum generated by the first error correction module according to the input signal and a parity check matrix, and the threshold is associated with the maximum error correction capability of the second error correction, when the intermediate signal is determined to be error-free, not performing the second error correction on the intermediate signal and outputting the intermediate signal as the corrected signal, wherein the second error correction is Boss-Chaudhuri-Hocquenghem (BCH) error correction, and the maximum error correction capability is associated with a maximum recovery bit count of the second error correction, wherein the termination condition is that an error level of the intermediate signal is smaller than the threshold, which is a product of the maximum error correction capability and a predetermined weighting, and wherein as a result of the threshold being calculated with respect to the maximum error correction capability, the second error correction completely corrects the intermediate signal.

* * * * *